(12) United States Patent  
Tsai

(10) Patent No.: US 7,420,425 B2
(45) Date of Patent: Sep. 2, 2008

(54) POWER AMPLIFIER AND METHOD THEREOF

(75) Inventor: Ming-Lin Tsai, Taipei (TW)

(73) Assignee: Via Technologies, Inc., Taipei (TW)

( * ) Notice: Subject to any disclaimer, the term of this patent is extended or adjusted under 35 U.S.C. 154(b) by 68 days.

(21) Appl. No.: 11/536,134

(22) Filed: Sep. 28, 2006

(65) Prior Publication Data
US 2008/0079499 A1    Apr. 3, 2008

(51) Int. Cl.
*H03F 3/04* (2006.01)
(52) U.S. Cl. .......................... 330/311; 330/51
(58) Field of Classification Search ............ 330/51, 330/98, 150, 302, 310, 311
See application file for complete search history.

(56) References Cited
U.S. PATENT DOCUMENTS
6,987,422 B2 * 1/2006 Vice .......................... 330/285
7,023,272 B2 * 4/2006 Hung et al. ................. 330/126
7,190,230 B1 * 3/2007 Jin et al. ..................... 330/311

\* cited by examiner

*Primary Examiner*—Henry K Choe
(74) *Attorney, Agent, or Firm*—Thomas, Kayden, Horstemeyer & Risley

(57) ABSTRACT

A power amplifier amplifying an input signal to generate an output signal, comprising a cascode unit and a bias circuit. The cascode unit comprises a cascode stage, a first input stage, and a second input stage. The cascode stage generates the output signal. The first input stage, in cascode with the cascode transistor, has a first signal input to be biased to provide a first amplifier gain. The second input stage, in cascode with the cascode transistor, has a second signal input to be biased to provide a second amplifier gain. The bias circuit, coupled to the first and the second input stages comprises first and second switches. The first switch, coupled to the first input stage, is switched on to bias the first input stage with a bias voltage. The second switch, coupled to the second input stage, is switched on to bias the second input stage with the bias voltage.

19 Claims, 8 Drawing Sheets

POWER AMPLIFIER AND METHOD THEREOF

BACKGROUND OF THE INVENTION

1. Field of the Invention

The invention relates to power amplifiers, and in particular to gain control of power amplifiers with low noise figure.

2. Description of the Related Art

Power amplifiers are widely employed in Radio Frequency (RF) transmitters or receivers in applications requiring the transmission of electromagnetic energy including GSM (Global System for Mobile Communications), EGSM (Extended GSM), PCS (Personal Communications Service), DCS (Digital Cellular System), 3G cellular applications such as EDGE (Enhanced Data Rates for GSM Evolution), CDMA (Code Division Multiple Access), WCDMA (Wideband CDMA), WiFi, UWB (Ultra Wideband), microwave communications, and the like.

In the case of an RF receiver, the received signal has a high dynamic range. Since baseband operates at a fixed voltage, a power amplifier with gain controllability is required in the RF receiver to convert wide dynamic range of the received signal to a constant. In transmitters, a power amplifier receives constant input signal levels and provides a varying range of output signal levels.

A noise figure (NF) is a ratio of actual output power to expected output power without noise introduced by the power amplifier, and is a function of amplifier gain and internal noise injection. To achieve a low NF, low noise amplification or higher power amplifier gain is employed. It is desirable to have a low NF in a power amplifier such that minimal transmission power may be achieved. However the high power amplifier gain for low NF compromises low power consumption for battery life. Thus there is a need for a power amplifier capable of gain adjustment at lower power consumption, to provide a better control over both.

BRIEF SUMMARY OF THE INVENTION

A detailed description is given in the following embodiments with reference to the accompanying drawings.

According to the invention, a power amplifier amplifying an input signal to generate an output signal is provided, comprising a cascode unit and a bias circuit. The cascode unit comprises a cascode stage, a first input stage, and a second input stage. The cascode stage generates the output signal. The first input stage, in cascode with the cascode transistor, has a first signal input to be biased to provide a first amplifier gain. The second input stage, in cascode with the cascode transistor, has a second signal input to be biased to provide a second amplifier gain. The bias circuit coupled to the first and the second input stages comprises first and second switches. The first switch, coupled to the first input stage, is switched on to bias the first input stage with a bias voltage. The second switch, coupled to the second input stage, is switched on to bias the second input stage with the bias voltage.

According to another embodiment of the invention, a method of amplifying an input signal to generate an output signal in a power amplifier is disclosed. The power amplifier comprises a cascode transistor, a first input stage in cascode with the cascode transistor, a second input stage in cascode with the cascode transistor, a first switch, and a second switch. The method comprises switching the first switch on to bias the first input stage with a bias voltage, and biasing a first signal input of the first input stage to provide a first amplifier gain.

According to yet another embodiment of the invention, an integrated circuit amplifying an input signal to generate an output signal comprises an input matching network, a cascode unit, a first compensation capacitor, a bias circuit, and an output matching network. The input matching network matches the input signal. The cascode unit, coupled to the input matching network, comprises a common-gate (CG) stage, a first common-source (CS) stage, and a second CS stage. The CG stage generates the output signal. The first CS stage, in cascode with the CG stage, has a first signal input to be biased to provide a first amplifier gain. The second CS stage, in cascode with the cascode transistor, has a second signal input to be biased to provide a second amplifier gain. The first compensation capacitor, coupled to the second CS stage, compensates input impedance of the second CS stage. The bias circuit, coupled to the first and the second CS stages, comprises first, second, third, and fourth switches, and a first compensation switch. The first switch, coupled to the first input stage, is switched on to bias the first input stage with a bias voltage. The second switch, coupled to the second input stage, is switched on to bias the second input stage with the bias voltage. The third switch, coupled to the first signal input and a ground, is complementary to the first switch, and switched on to connect the first signal input to the ground. The fourth switch, coupled to the second signal input and the ground, is complementary to the second switch, and switched on to connect the second signal input to the ground. The first compensation switch, coupled to the first compensation capacitor and the second input stage, is switched on to connect the first compensation capacitor to the second signal input. The output matching network, coupled to the CG stage, matches the output signal.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limit sense. The scope of the invention is best determined by reference to the appended claims.

Scope of the invention may include, but is not limited to power amplification for 2G cellular applications including GSM, EGSM, PCS, DCS, 3G cellular applications such as EDGE, CDMA, WCDMA (Wideband CDMA), WiFi, UWB, and the like.

Figure 1:
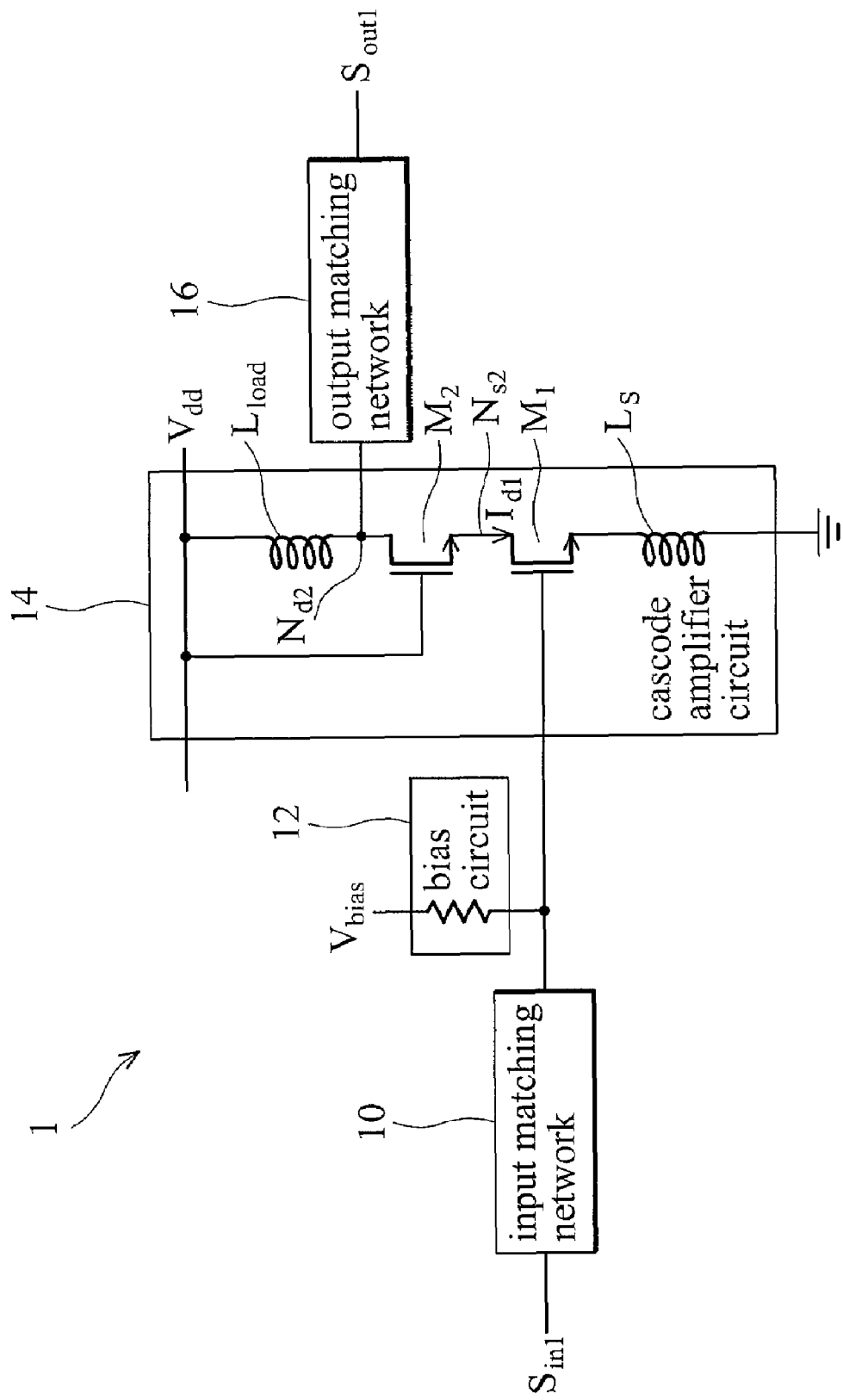
FIG. 1 is a schematic diagram of a conventional single ended cascode power amplifier.

FIG. 1 is a schematic diagram of a conventional single ended cascode power amplifier, comprising input matching network 10, bias circuit 12, cascode amplifier circuit 14, and output matching network 16. Input matching network 10 and bias circuit 12 are coupled to cascode amplifier circuit 14, and subsequently to output matching network 16. Power amplifier 1 is suitable for on-chip transmitters or receivers, with low noise figure (NF) characteristics.

Input matching network 10 and output matching network 16 provide signal matching to input signal $S_{in1}$ and output signal $S_{out1}$ respectively. Bias circuit 12 produces bias voltage $V_{bias1}$ biasing cascode amplifier circuit 14 operating at an active range. Cascode amplifier circuit 14 comprises inductive source degeneration load $L_s$, input MOS transistor $M_1$, cascode MOS transistor $M_2$, and inductive load $L_{load}$. Input transistor $M_1$ is in a common source (CS) configuration, receiving bias voltage $V_{bias1}$ from bias circuit 12 and input signals $S_{in1}$ from input matching network 10. Bias voltage $V_{bias1}$ biases input MOS transistor $M_1$ at the MOS saturation range, so that input signal $S_{in1}$ is amplified by transconductance gain G to generate drain current $I_d$. Cascode MOS transistor $M_2$ is in a common gate (CG) configuration biased by supply voltage $V_{dd}$, establishing output voltage signal $S_{out1}$ at drain terminal $N_{d2}$ and lower voltage variation at source terminal $N_{s2}$, reducing Miller effect experienced by input MOS transistor M1 across gate-drain terminals thereof, while providing high output impedance at drain terminal $N_{d2}$.

Since gain G is fixed by device dimension of input MOS transistor M1, power amplifier 1 is incapable of adjusting gain G, resulting in fixed current $I_d$ and power consumption.

Figure 2:
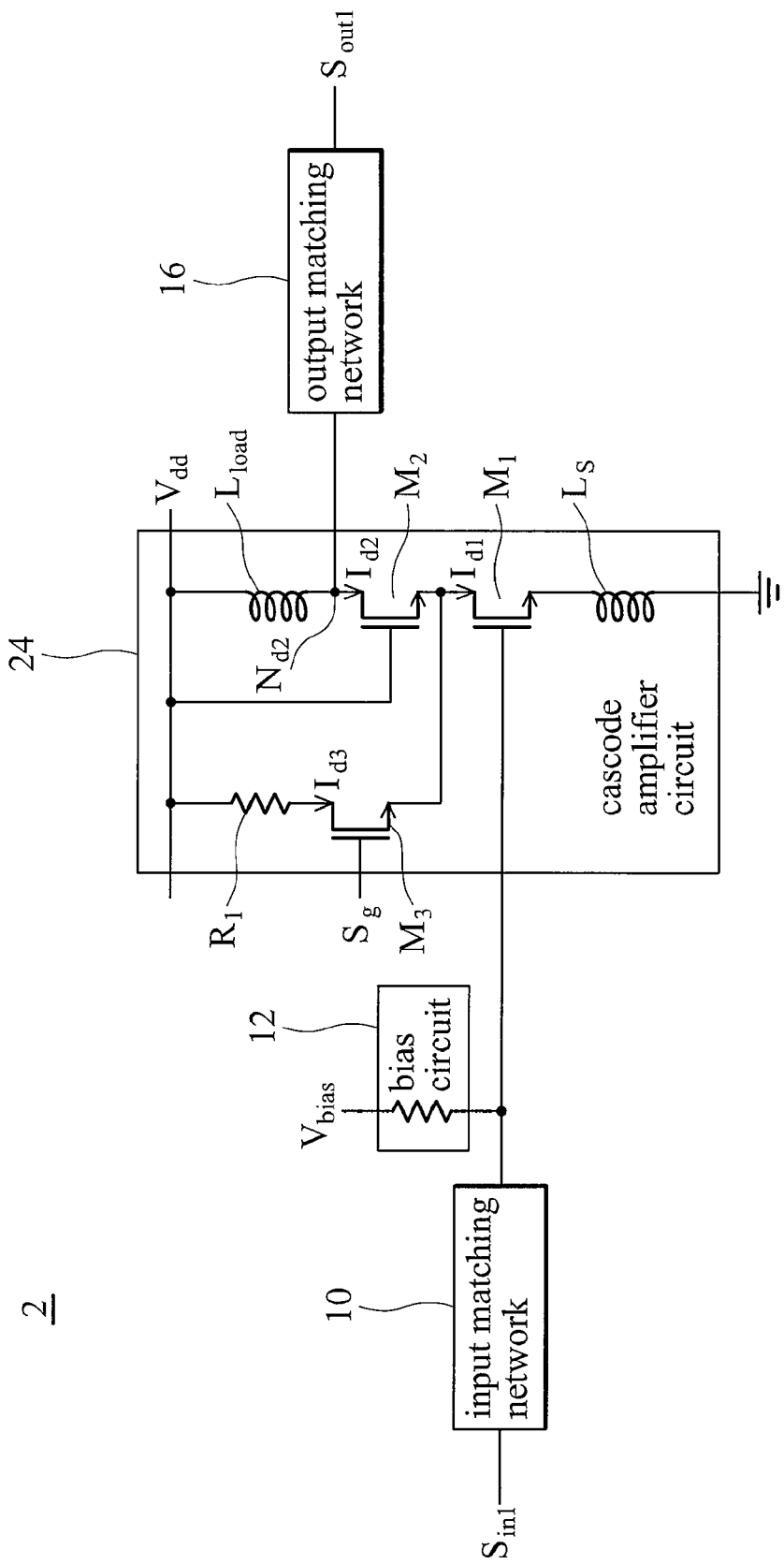
FIG. 2 is a schematic diagram of another conventional power amplifier capable of gain adjustment.

FIG. 2 is a schematic diagram of another conventional power amplifier capable of gain adjustment, comprising input matching network 10, bias circuit 12, cascode amplifier circuit 24, and output matching network 16. Input matching network 10 and bias circuit 12 are coupled to cascode amplifier circuit 24, subsequently to output matching network 16.

Input matching network 10, bias circuit 12, and output matching network 16 are identical to the corresponding circuits in power amplifier 1. Cascode amplifier circuit 24 comprises inductive source degeneration load $L_s$, input MOS transistor $M_1$, cascode MOS transistor $M_2$, inductive load $L_{load}$, transistor $M_3$, and resistor $R_1$. Transistor $M_3$ is coupled to resistor $R_1$, forming an additional current path, such that third drain current $I_{d3}$ through third transistor $M_3$ and second drain and second drain current $I_{d2}$ through cascode MOS transistor $M_2$ are combined into first drain current $I_{d1}$ through input MOS transistor $M_1$. When gain control signal $S_g$ increases, transistor $M_3$ turns on gradually, resulting in higher third drain current $I_{d3}$ through transistor $M_3$ and less second drain current $I_{d2}$ through cascode MOS transistor $M_2$, thereby decreasing output voltage signal $S_{out1}$ established at drain terminal $N_{d2}$.

Although power amplifier 2 is capable of adjusting gain G, extra current $I_{d3}$ is merely redistributed through transistor $M_3$ and resistor $R_1$, so that power consumption in power amplifier 2 is not reduced in comparison to power amplifier 1.

Figure 3:
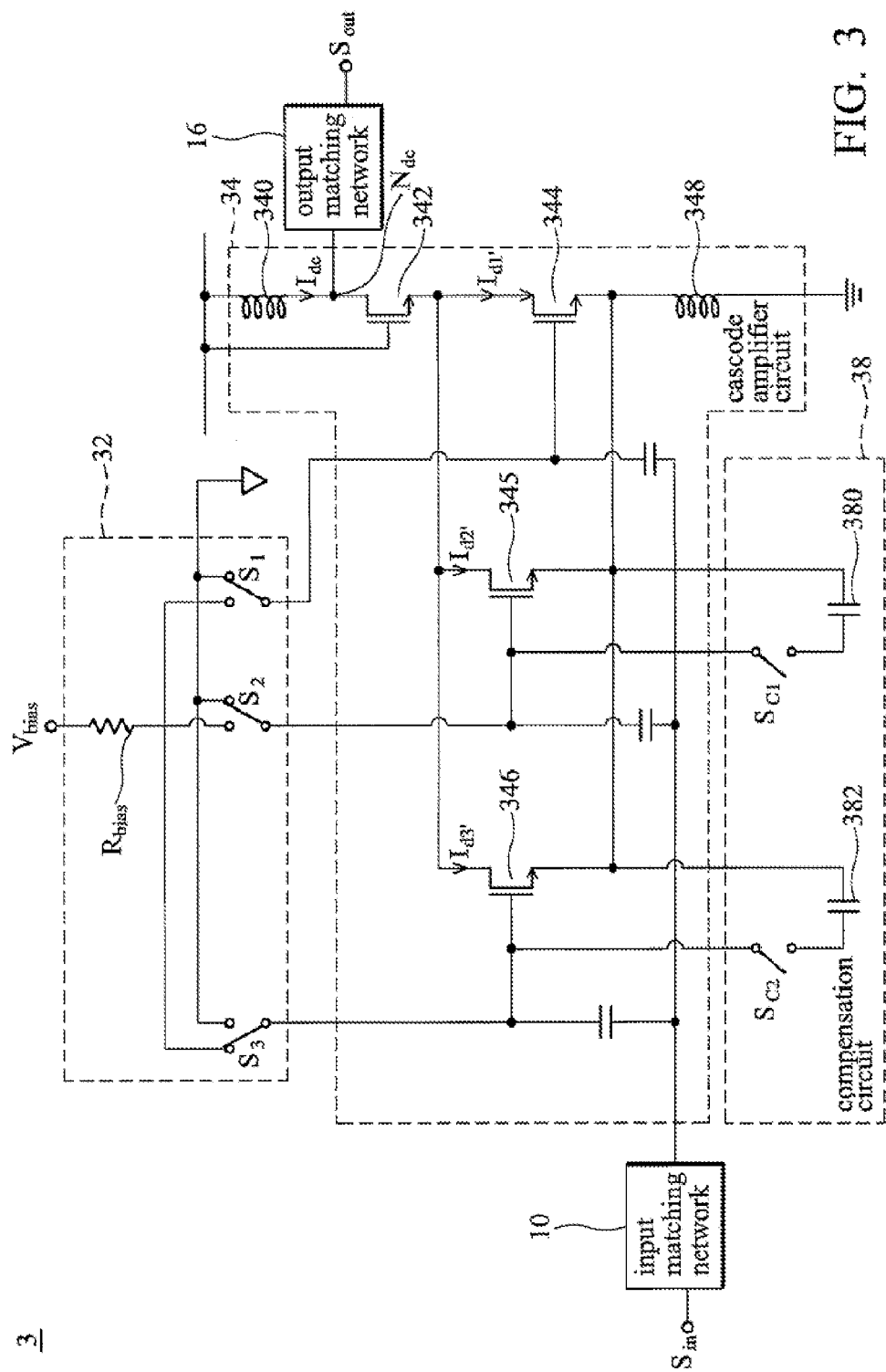
FIG. 3 is a schematic diagram of an exemplary power amplifier according to the invention.

FIG. 3 is a schematic diagram of an exemplary power amplifier according to the invention, comprising input matching network 10, bias circuit 32, cascode amplifier circuit 34, output matching network 16, and compensation circuit 38. Input matching network 10 and bias circuit 32 are coupled to cascode amplifier circuit 34 and compensation circuit 38, then to output matching network 16.

Input matching network 10 matches and delivers input signal $S_{in}$ to input stages of cascode amplifier circuit 34. Input signal $S_{in}$ may be a radio frequency (RF) signal undergoing power amplification prior to transmission.

Cascode amplifier circuit 34 comprises bias load 340, first cascode stage 342, first input stage 344, second input stage 345, third input stage 346, and source degeneration inductor 348. Bias load 340 is coupled to first cascode stage 342, in cascode with first cascode stage 342, first input stage 344, and second input stage 345, and then coupled to source degeneration inductor 348.

Bias load 340 may be inductive. Source degeneration inductor 348 is coupled between first input stage 344, second input stage 345, third input stage 346, and a ground, removing capacitive reactance at the first, second and third signal inputs to restore pure resistance thereto.

Figure 7A:
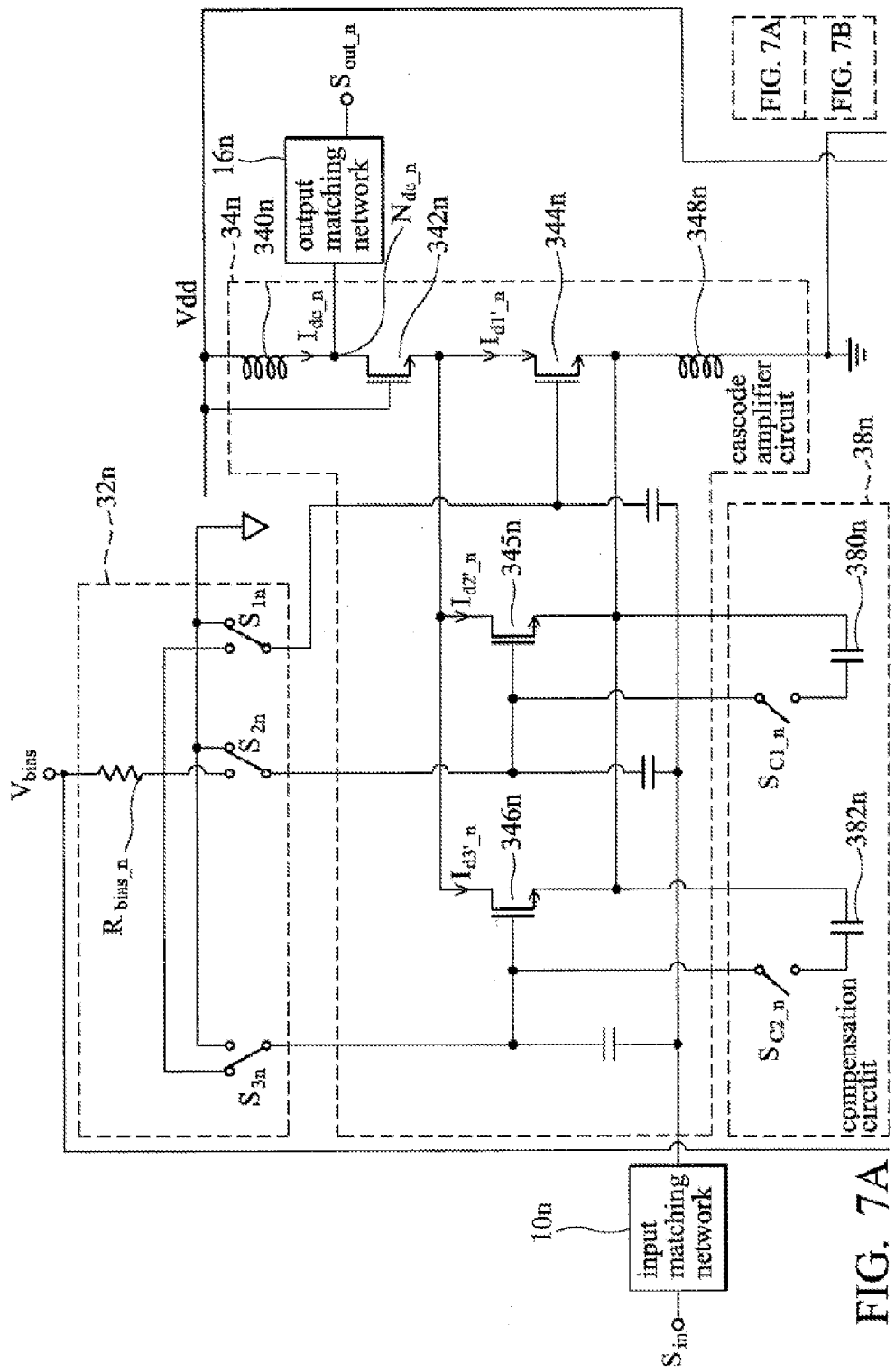
FIGS. 7A and 7B illustrate a power amplifier, constructed in accordance with an embodiment of the invention.
Figure 7B:
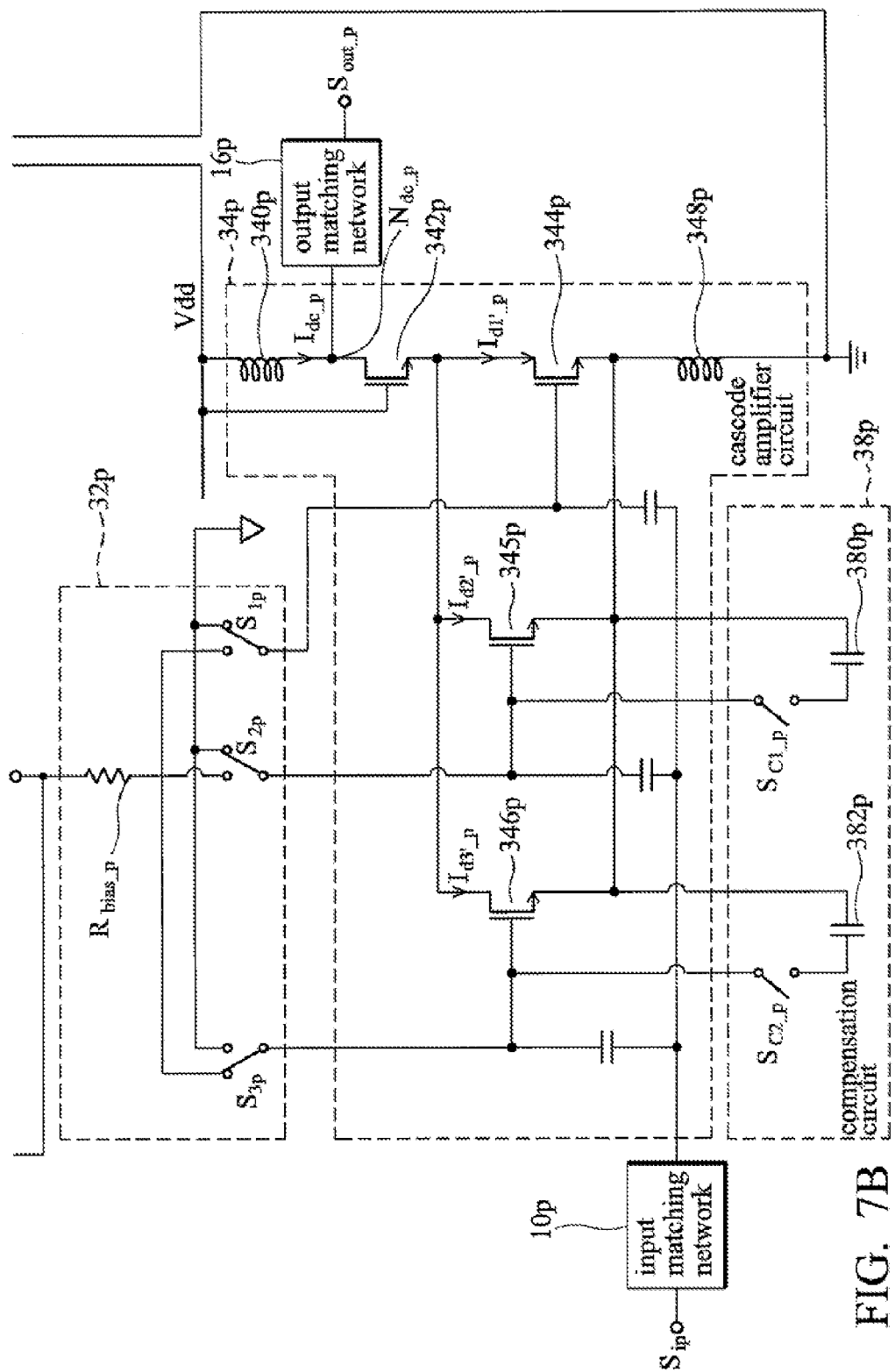

In an embodiment, first input stage 344, second input stage 345, third input stage 346, and first cascode stage 342 are MOSFET transistors, in which first input stage 344, second input stage 345, third input stage 346 are configured in common-source (CS) arrangement and first cascode stage 342 in common-gate (CG) arrangement connected in cascode thereto. Each input stage may comprise different device dimensions and transistor counts, resulting in a different amplifier gain corresponding thereto. First input stage 344, second input stage 345, and third input stage 346 are biased and receive input signal $S_{in}$ at a corresponding signal input to convert a gate-source voltage with transconductance gain G1, G2, and G3 to corresponding drain currents $I_{d1}'$, $I_{d2}'$, and $I_{d3}'$. In an example, $G_1$ is 10 dB, $G_2$ is 2 dB, $G_3$ is –7 dB. Selecting one or a combination of first input stage 344, second input stage 345, and third input stage 346 by appropriate bias produces different overall gain $G_{PA}$ for power amplifier 3. Since decreasing gain $G_{PA}$ leads to decreased drain currents through transistors, power consumption of power amplifier 3 is reduced accordingly. In another embodiment, power amplifier 3 adopts BJT technology, and first input stage 344, second input stage 345, third input stage 346 are in common-emitter (CE) arrangement and first cascode stage 342 in common-base (CB) arrangement connected in cascode thereto. Similarly, gain control is achieved by biasing one or a combination of first input stage 344, second input stage 345, and third input stage 346, resulting in desirable gain GPA and power reduction. First cascode stage 342 establishes output signal $S_{out}$ at node $N_{dc}$ based on drain current $I_{dc}$ therethrough, output matching network 16 in turn to match and transmit output signal $S_{out}$ for transmission or further processing. In an embodiment shown in FIGS. 7A and 7B, input signal is a differential signal pair comprising $S_{in}$ and $S_{ip}$, and the first cascode stage, and the input stages are differential transistor pairs receiving the differential signal pair. The differential power amplifier in FIGS. 7A and 7B amplifies the differential input signal pair according to the principle disclosed in FIG. 3. the amplifier circuit is modified where appropriate to accommodate the circuit requirement for the differential signals.

Compensation circuit 38 comprises first compensation capacitor 380 and second compensation capacitor 382. First compensation capacitor 380 is coupled to bias circuit 32, first second input stage 344, and second input stage 345. Second compensation capacitor 382 is coupled to bias circuit 32, first second input stage 344, and third input stage 346. Given that signal input terminals of transistors have different input impedance characteristics for "ON" and "OFF" states, compensation capacitors are utilized to compensate change in input impedance arising from biasing different transistors in input stages 344, 345, and 346. For example, in a power amplifier with only input stage 344 and 345 in cascode with first cascode transistor 342, first input stage 344 may comprise 22 MOSFET transistors in parallel, and second input stage 345 may comprise 11 MOSFET transistors, biasing first input stage 344 results in only an input impedance with 22 "ON" and 11 "OFF" MOSFET transistors, and biasing second input stage 345 results in only an input impedance with 11 "ON" and 22 "OFF" MOSFET transistors, thus it is necessary to have a compensation capacitor therebetween to accommodate the change in input impedance. First compensation capacitor 380 compensates for input impedance difference between first and second input stages 344 and 345. Second compensation capacitor 382 compensates for input impedance difference between first and third input stages 344 and 346. First compensation capacitor 380 and second compensation capacitor 382 may be realized by MOSFET transistors.

Bias circuit 32 comprises bias resistor $R_{bias}$, first switch $S_1$, second switch $S_2$, third switch $S_3$, first compensation switch $S_{C1}$, and second compensation switch $S_{C2}$. First switch $S_1$, second switch $S_2$, and third switch $S_3$ are select bias states of input stages 344, 345, and 346. First compensation switch $S_{c1}$ and second compensation switch $S_{C2}$ control input impedance compensation of input stages 344, 345, and 346.

Referring to FIG. 3, first input stage 344 is enabled by switching first switch $S_1$ to bias voltage $V_{bias}$, and disabled by switching to the ground. Upon enablement, stage 344 is biased by bias voltage $V_{bias}$ through bias resistor $R_{bias}$ to produce first gain $G_1$. During disablement, first input stage 344 is connected to ground and turned off, thereby reducing power dissipation. Likewise, second input stage 345 and third input stage 346 are controlled by connecting second switch S2 and third switch S3 to bias voltage $V_{bias}$ or the ground. Power amplifier 3 adjusts output gain G by controlling switches S1, S2 and S3, connecting a desirable input stage to bias voltage Vbias for proving gain G, and disconnecting an unwanted stage to ground for reducing power dissipation.

First compensation switch $S_{c1}$ is coupled to second input stage 345 and first compensation capacitor 380, switched on to connect second input stage 345 and first compensation capacitor 380 when third switch $S_3$ is closed to enable second input stage 345, providing input impedance compensation thereby. Similarly second compensation switch $S_{c2}$ is coupled to third input stage 345 and second compensation capacitor 382, switched on to connect third input stage 345 and second compensation capacitor 382 when fifth switch $S_5$ is closed to enable third input stage 346, and providing input impedance compensation by second compensation capacitor 382.

Figure 4:
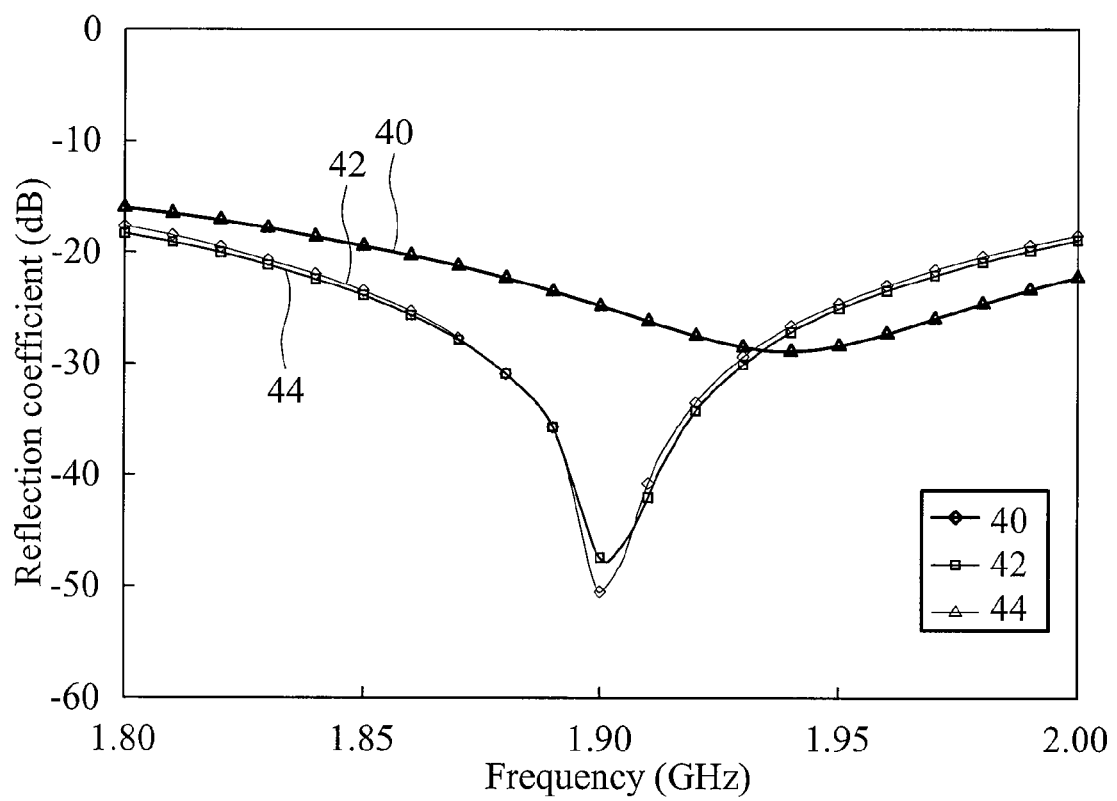
FIG. 4 is a diagram showing frequency versus reflection coefficient (S11) at the input terminal, incorporating the power amplifier in FIG. 3.

FIG. 4 is a diagram showing frequency versus reflection coefficient (S11) at the input terminal, incorporating the power amplifier in FIG. 3, comprising high gain curve 40, medium gain curve 42, and low gain curve 44. High gain curve 40 corresponds to switching on first input stage 344 and the other input stages 345 and 345 are off. Similarly, medium gain curve 42 corresponds only to second input stage 345 on and low gain curve 44 corresponds only to third input stage 346 on. Curves 40, 42 and 44 show low reflection coefficient over the spectrum of interest centered at 1.9 GHz, indicating good input matching.

Figure 5:
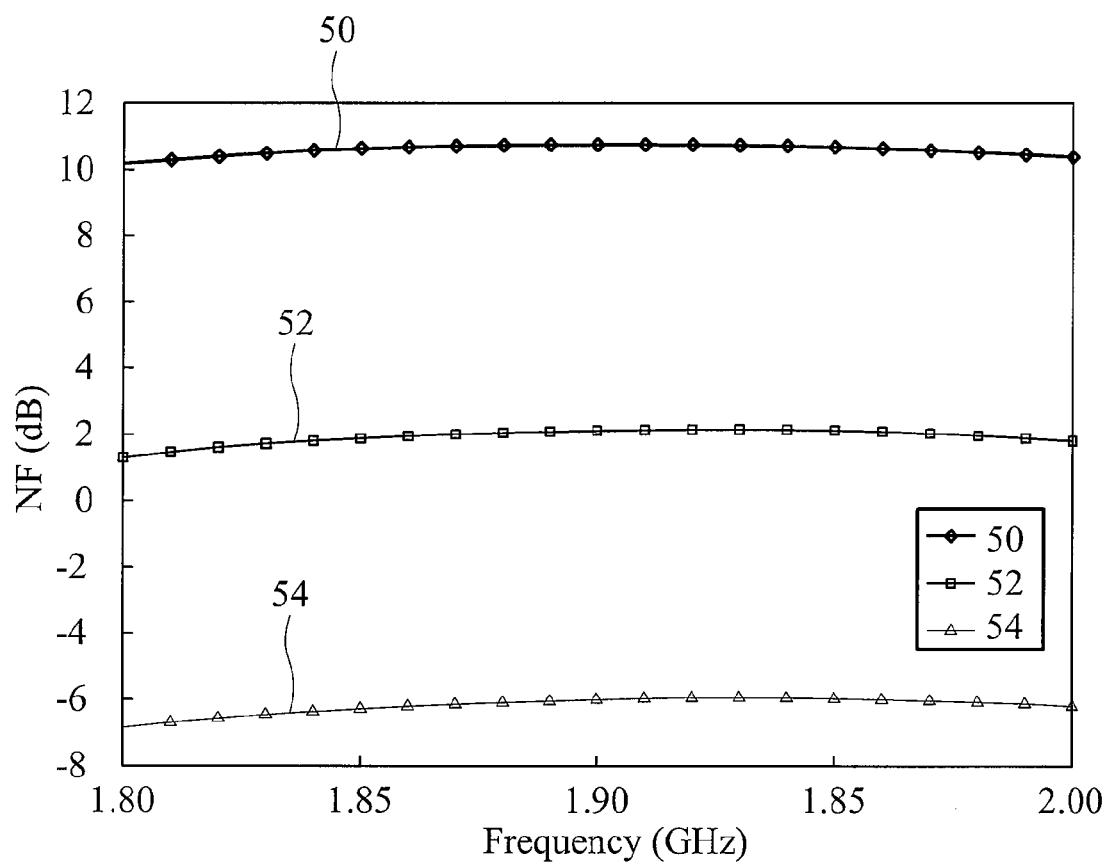
FIG. 5 is a diagram showing frequency versus gain (S21), incorporating the power amplifier in FIG. 3.

FIG. 5 is a diagram showing frequency versus gain (S21), incorporating the power amplifier in FIG. 3, comprising high gain curve 50, medium gain curve 52, and low gain curve 54. High gain curve 50 corresponds to biasing first input stage 344 only, medium gain curve 52 corresponds to second input stage 345, and low gain curve 54 corresponds to third input stage 346. Curves 50, 52, and 54 show constant gains across spectrum between 1.8 to 2 GHz, with high gain curve 50 produce a 10 dB gain, medium gain curve 52 a 2 dB gain, and low gain curve 54 a −7 dB gain.

Figure 6:
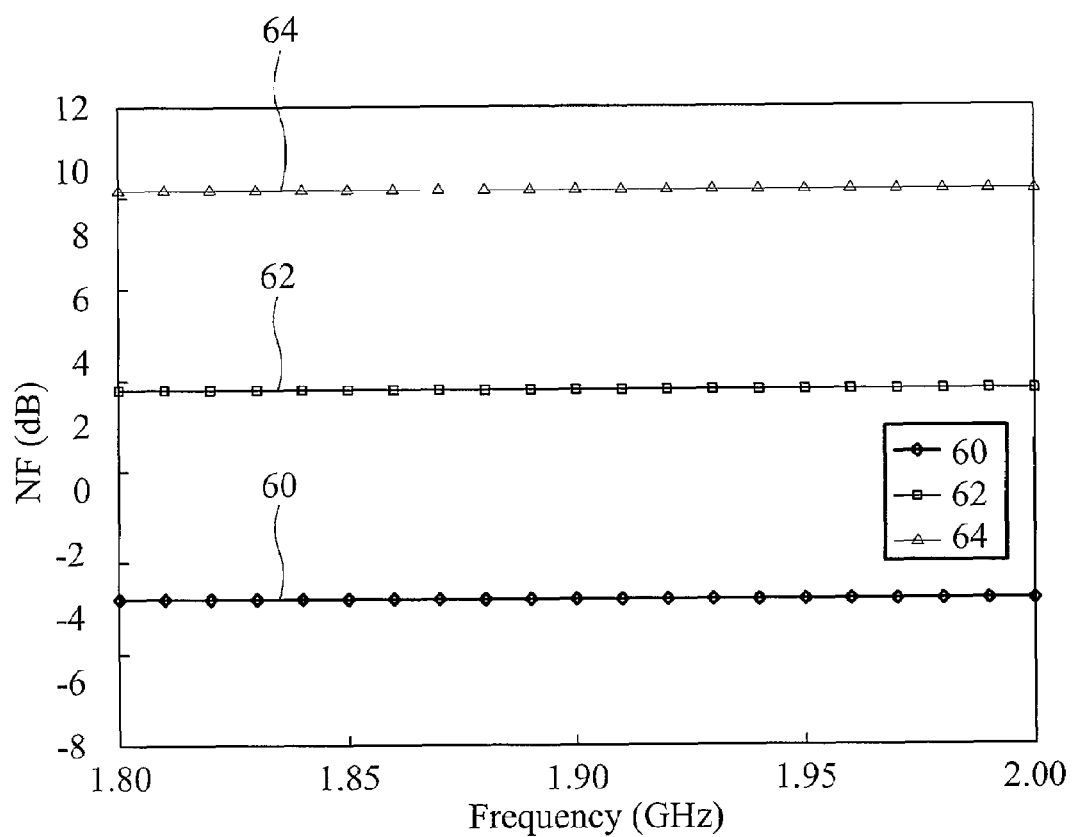
FIG. 6 is a diagram showing frequency versus noise figure (NF), incorporating the power amplifier in FIG. 3.

FIG. 6 is a diagram showing frequency versus noise figure (NF), incorporating the power amplifier in FIG. 3, comprising high gain curve 60, medium gain curve 62, and low gain curve 64. High gain curve 60 corresponds to biasing first input stage 344 only, medium gain curve 62 corresponds to second input stage 345, and low gain curve 64 corresponds to third input stage 346. High gain curve 60 shows a 3 dB noise figure, medium gain curve 62 shows an 8 dB NF, and low gain curve 64 shows a 12 dB NF.

The power amplifier in the invention may be incorporated into a receiver in an RF circuit to provide low noise figures, gain controllability, and low power consumption, while preserving the capability of input impedance matching.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A power amplifier amplifying an input signal to generate an output signal, comprising:
   a cascode unit comprising:
      a cascode stage generating the output signal;
      a first input stage in cascode with the cascode stage, having a first signal input to be biased to provide a first amplifier gain; and
      a second input stage in cascode with the cascode stage, having a second signal input to be biased to provide a second amplifier gain; and
   a bias circuit coupled to the first and the second input stages, comprising:
      a first switch coupled to the first input stage, switched to a bias voltage to enable the first input stage; and
      a second switch coupled to the second input stage, switched to the bias voltage to enable the second input stage.

2. The power amplifier of claim 1, wherein the cascode unit is inductive source degenerated and comprises a source degeneration inductor coupled to the first input stage.

3. The power amplifier of claim 1, wherein only one of the first and the second switches is switched on at a time.

4. The power amplifier of claim 1, wherein both the first and the second switches are switched on.

5. The power amplifier of claim 1, wherein the first switch further switches to the ground to disable the first input stage, and the second switch further switches to the ground to disable the second input stage.

6. The power amplifier of claim 1, further comprising:
   a first compensation capacitor coupled to the second input stages and the bias circuit, compensating input impedance of the second input stage; and
   wherein the bias circuit further comprises a first compensation switch coupled to the first compensation capacitor and the second input stage, switched on to connect the first compensation capacitor to the second signal input.

7. The power amplifier of claim 6, further comprising a second compensation capacitor coupled to the cascode unit and the bias circuit;
   wherein the cascode unit further comprises a third input stage coupled to the first cascode stage in cascode and the second compensation capacitor, having a third signal input to be biased to provide a third amplifier gain; and
   the bias circuit further comprises:
      a fifth switch coupled to the third input stage, switched to the bias voltage to enable the third input stage; and a second compensation switch coupled to the second compensation capacitor and the third input stage, switched on to connect the second compensation capacitor to the third signal input.

8. The power amplifier of claim 1, wherein the first and the second input stages are MOSFET transistors in common-source (CS) configuration, and the cascode stage is an MOSFET transistor in common-gate (CG) configuration.

9. The power amplifier of claim 1, wherein the first and the second input stages are BJT transistors in common-emitter (CE) configuration, and the cascode stage is a BJT transistor in common-base (CB) configuration.

10. The power amplifier of claim 1, wherein the input signal comprises a differential signal pair, and the first cascode stage, the first and the second input stages are differential transistor pairs receiving the differential signal pair.

11. A method of amplifying an input signal to generate an output signal in a power amplifier comprising a cascode stage, a first input stage in cascode with the cascode stage, a second input stage in cascode with the cascode stage, a first switch, and a second switch, the method comprising:

the first switch switching to a bias voltage to enable the first input stage;

biasing a first signal input of the first input stage to provide a first amplifier gain;

the second switch switching to the bias voltage to enable the second input stage; and biasing a second signal input of the second input stage to provide a second amplifier gain.

12. The method of claim 11, further comprising:

the first switch switching to the ground to disable the first input stage; and the second switch switching to the ground to disable the second input stage.

13. The method of claim 11, wherein the power amplifier further comprises a first compensation capacitor and a first compensation switch, the method further comprising:

switching on the first compensation switch to connect the compensation capacitor to the second signal input; and the first compensation capacitor compensating input impedance of the second input stage.

14. The method of claim 13, wherein the power amplifier further comprises a third input stage, a second compensation capacitor, a third switch and a second compensation switch, the method further comprising the third switch switching to the bias voltage to enable the third input stage;

biasing a third signal input of the third input stage to provide a third amplifier gain;

switching on the second compensation switch to connect the compensation capacitor to the third signal input; and the second compensation capacitor compensating input impedance of the third input stage.

15. The method of claim 11, wherein the first input stage is a MOSFET transistor in common-source (CS) configuration, and the cascode stage is an MOSFET transistor in common-gate (CG) configuration.

16. The method of claim 13, wherein the first input stage is a BJT transistor in common-emitter (CE) configuration, and the cascode stage is a BJT transistor in common-base (GB) configuration.

17. The method of claim 13, wherein the input signal comprises a differential signal pair, and the first cascode stage, the first and the second input stages are differential transistor pairs receiving the differential signal pair.

18. An integrated circuit amplifying an input signal to generate an output signal, comprising:

an input matching network, matching the input signal;

a cascode unit coupled to the input matching network, comprising:

a common-gate (CG) stage generating the output signal;

a first common-source (CS) stage in cascode with the CG stage, having a first signal input to be biased to provide a first amplifier gain; and a second CS stage in cascode with the CG stage, having a second signal input to be biased to provide a second amplifier gain;

a first compensation capacitor coupled to the second CS stage, compensating input impedance of the second CS stage;

a bias circuit coupled to the first and the second CS stages, comprising:

a first switch coupled to the first input stage, switched to a bias voltage to enable the first input stage, switched to the ground to disable the first input stage;

a second switch coupled to the second input stage, switched to the bias voltage to enable the second input stage, switched to the ground to disable the second input stage; and a first compensation switch coupled to the first compensation capacitor and the second input stage, switched on to connect the first compensation capacitor to the second signal input; and an output matching network coupled to the CG stage, matching the output signal.

19. The integrated circuit of 18, further comprising a source degeneration inductor coupled to the first and the second CS stages.

* * * * *